United States Patent
Tanaka

(10) Patent No.: US 7,042,152 B2
(45) Date of Patent: May 9, 2006

(54) ORGANIC ELECTROLUMINESCENCE DEVICE INCLUDING OXYGEN IN AN INTERFACE BETWEEN ORGANIC LAYER AND CATHODE

(75) Inventor: Taizou Tanaka, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/981,161

(22) Filed: Oct. 16, 2001

(65) Prior Publication Data

US 2002/0043934 A1    Apr. 18, 2002

(30) Foreign Application Priority Data

Oct. 17, 2000    (JP)  .............................. 2000-317165

(51) Int. Cl.
*H01J 1/62*    (2006.01)

(52) U.S. Cl. ........................ 313/506; 313/504; 313/512

(58) Field of Classification Search ................ 313/504, 313/505, 506, 509, 512; 428/690, 917; 315/169.3
See application file for complete search history.

(56) References Cited

U.S. PATENT DOCUMENTS

| | | | | |
|---|---|---|---|---|
| 5,739,545 A | * | 4/1998 | Guha et al. ................ 257/40 |
| 5,776,622 A | * | 7/1998 | Hung et al. ................ 428/690 |
| 6,166,488 A | * | 12/2000 | Arai ........................... 313/504 |
| 6,194,119 B1 | * | 2/2001 | Wolk et al. ................. 430/200 |
| 6,291,116 B1 | * | 9/2001 | Wolk et al. .................... 430/14 |
| 6,303,239 B1 | | 10/2001 | Arai et al. ................... 428/690 |
| 6,316,874 B1 | * | 11/2001 | Arai et al. ................... 313/504 |
| 6,402,579 B1 | * | 6/2002 | Pichler et al. ................ 445/24 |
| 6,534,202 B1 | * | 3/2003 | Sato et al. .................. 428/690 |

FOREIGN PATENT DOCUMENTS

| | | | | |
|---|---|---|---|---|
| JP | 9-23207 | * | 9/1997 | |
| JP | 09232079 A | * | 9/1997 | |
| JP | 11121176 A | * | 4/1999 | |
| JP | 11-312580 | | 11/1999 | |
| JP | 2000-012237 | | 1/2000 | |
| JP | 2000-123976 | | 4/2000 | |
| JP | 2000182774 A | * | 6/2000 | |
| JP | 2000-188184 | | 7/2000 | |

\* cited by examiner

*Primary Examiner*—Karabi Guharay
(74) *Attorney, Agent, or Firm*—H.C. Park & Associates, PLC

(57) ABSTRACT

Provided are an organic EL device and method of fabricating the same. The organic EL device includes a main element portion in which an anode, a hole transport layer, an organic emission layer, a first cathode, and a second cathode are stacked on a transparent insulating substrate, wherein oxygen is contained at an interface between the organic emission layer and the first cathode, so that the throughput for the device fabrication may not be lowered and a high rectification ratio may be obtained.

2 Claims, 8 Drawing Sheets

2; ANODE
1; TRANSPARENT INSULATING SUBSTRATE

3; HOLE TRANSPORT LAYER
4; ORGANIC EMISSION LAYER

5B; SECOND CATHODE
5A; FIRST CATHODE

7; CAP
10; ORGANIC EL DEVICE

FIG. 6

| No | OXYGEN PARTIAL PRESSURE (PA) | RECTIFICATION RATIO (AT APPLIED 8V) |
|---|---|---|
| 1 | $2 \times 10^{-4}$ | $3 \times 10^{8}$ |
| 2 | $2 \times 10^{-3}$ | $2 \times 10^{8}$ |
| 3 | $5 \times 10^{-2}$ | $1 \times 10^{8}$ |
| 4 | $1 \times 10^{-1}$ | $2 \times 10^{8}$ |

FIG. 7

| No | OXYGEN PARTIAL PRESSURE (PA) | RECTIFICATION RATIO (AT APPLIED 8V) |
|---|---|---|
| 1 | $1 \times 10^{-4}$ | $3 \times 10^{4}$ |
| 2 | $2 \times 10^{-5}$ | $2 \times 10^{4}$ |

FIG. 8

| No | THICKNESS OF FIRST CATHODE (NM) | RECTIFICATION RATIO (AT APPLIED 8V) |
|---|---|---|
| 1 | 20 | $3.9 \times 10^8$ |
| 2 | 40 | $1.2 \times 10^8$ |
| 3 | 70 | $1.6 \times 10^8$ |
| 4 | 100 | $2.7 \times 10^8$ |

FIG. 9

| No | THICKNESS OF FIRST CATHODE (NM) | RECTIFICATION RATIO (AT APPLIED 8V) |
|---|---|---|
| 1 | 10 | $1.0 \times 10^6$ |
| 2 | 200 | $6.9 \times 10^3$ |
| 3 | 300 | $4.2 \times 10^2$ |
| 4 | 500 | $5.2 \times 10^2$ |

ORGANIC ELECTROLUMINESCENCE DEVICE INCLUDING OXYGEN IN AN INTERFACE BETWEEN ORGANIC LAYER AND CATHODE

BACKGROUND OF THE INVENTION

1. Field of the Invention

The present invention relates to an organic EL (electroluminescence) device and a method for manufacturing the organic EL device and more particularly to the organic EL device in which device main components having at least one organic light emitting layer and a cathode and containing oxygen in an interface between the organic light emitting layer and the cathode.

The present application claims priority of Japanese Patent Application No. 2000-317165 filed on Oct. 17, 2000, which is hereby incorporated by reference.

2. Description of the Related Art

As one type of an EL device used in display units for information devices or a like, an organic EL device is being developed. FIG. 10 is a diagram schematically showing configurations of a well-known and general organic EL device.

As shown in FIG. 10, the general organic EL device includes a transparent insulating substrate 51 made of a glass substrate or a like, device main components having an anode 52 (lower electrode) made of a transparent conductive material such as ITO (Indium Tin Oxide) formed on the transparent insulating substrate 51, a hole transporting layer 53 formed on the anode 52, an organic light emitting layer 54 formed on the hole transporting layer 53, a cathode 55 (upper electrode) made of AlLi (aluminum lithium) or a like formed on the organic light emitting layer 54, and a cap 57 made of glass or a like mounted, with encapsulating resin 56 interposed between the transparent insulating substrate 51 and the cap 57, on the transparent insulating substrate 51 so as to cover the main components formed on the transparent insulating substrate 51. As the encapsulating resin 56, for example, a UV (Ultra-violet rays) curable resin is used. By applying light containing UV fed from a light source to the encapsulating resin 56, the encapsulating resin 56 is cured so as to carry out encapsulation.

Since a state at an interface between the organic light emitting layer 54 and the cathode 55 is not perfect, an unstable defect exists. That is, the defect here represents an impurity level caused by a lattice defect or a like existing at a place where an interface, level should be formed. Due to this defect, in addition to a path through which a carrier has to flow originally, another path is produced, which causes occurrence of a leakage current. Furthermore, there is a danger that the cathode 55 is shorted to the anode 52. As a result, properties of the organic EL device become unstable, thus making impossible to obtain a high rectification ratio and, therefore, when the organic EL device is driven in a simple matrix manner, a pixel short and/or crosstalk occur.

Here, a perfect state of interface means a state in which there is no level derived from the defect in the interface level at the interface between the organic light emitting layer 54 and the cathode 55 and there is a state in which an electron implantation can be smoothly performed by a heat exciting current, or a state in which a level that can induce a tunnel effect exists in a stable state. In contrast, an imperfect state of the interface means a state in which many interface levels are formed or vanished repeatedly due to the occurrence of the defects, causing variations in implanting characteristics. Therefore, it is necessary for the organic EL device to have the perfect state of the interface between the organic light emitting layer 54 and the cathode 55 and stable interface level. This enables an increase in the leakage current to be inhibited and the short between the cathode 55 and anode 52 to be avoided, thus the properties of the organic EL device to be made stable.

To solve this problem, an organic EL device is disclosed in, for example, Japanese Laid-open Patent Application No. Hei 11-312580 in which device elements such as the organic light emitting layers or a like are encapsulated in an atmosphere of oxidative gas to make stable the characteristic of the organic EL device. The disclosed organic EL device includes, as shown in FIG. 11, a glass substrate 61, an anode 62 made of ITO formed on the glass substrate 61, an organic film 63 having, for example, a stacked layer containing a hole transporting material and a light emitting layer formed on the anode 62, a cathode 64 having a metal consisting of MgAg (magnesium silver) or stacked layers of LiF (lithium fluoride) and Al (aluminum) on the organic film 63, and an enclosure 66 encapsulating the device elements (that is, the anode 62, organic film 63, and cathode 64) in a manner so as not to stick to the device element using an encapsulating resin 65 made of a UV curable resin or a like.

Gas containing oxidative gas is injected into the encapsulated space. The gas includes mixed gas of oxidative gas ($O_2$, $N_2O$ or a like) and non-oxidative gas (inert gas such as $N_2$, Ar, He, or a like). A concentration of the oxidized gas is set to 0.1 to 20%. Here, injection of the mixed gas is performed in a manner that the glass substrate 61 on which the device elements are formed is carried from a deposition chamber into a pre-degassing chamber in a vacuum state in which the enclosure 66 has been set and the mixed gas is introduced into the pre-degassing chamber until a pressure of the mixed gas becomes at an atmospheric level and the encapsulating resin 65 is cured by a UV lamp to complete the encapsulation.

By configuring as above, even if a short occurs between the anode 62 and the cathode 64 due to particles existing therein, since the particles are oxidized by the oxidative gas and go insulative, an insulating state between the anode 62 and the cathode 64 is restored and a life of the organic EL device is improved.

However, the method for manufacturing the organic EL device disclosed in Japanese Laid-open Patent Application Hei 11-312580 presents a problem. That is, in the disclosed method, since considerations are given only to a method of preventing the short between the anode 62 and cathode 64 due to particles, it is difficult to obtain a high rectification ratio without reducing a throughput for manufacturing the organic EL device.

That is, in the disclosed method, the life of the organic EL device is improved by introducing the mixed gas of the oxidative gas and non-oxidative gas before being encapsulated and by oxidizing the particles existing between the anode 62 and cathode 64 using the oxidative gas. In this case, as described by the paragraph number 0025 in Japanese Laid-open Patent Application Hei 11-312580, the cathode 64 of the organic EL device is formed so that its thickness becomes as comparatively large as 180 nm and the cathode 64 having the large thickness makes it impossible to provide the high rectification ratio. Therefore, if the rectification ratio has to be made larger, since the cathode 64 has to be formed so as to have a smaller thickness, a yield in the manufacturing of the organic EL device becomes lower, thus inevitably causing decrease of the throughput.

SUMMARY OF THE INVENTION

In view of the above, it is an object of the present invention to provide an organic EL device and a method for manufacturing the organic EL device which are capable of providing a high rectification ratio without reducing a throughput in manufacturing the organic EL device.

According to a first aspect of the present invention, there is provided an organic EL device including:

an anode;

an organic layer containing at least one organic light emitting layer;

a cathode;

a cap used to encapsulate device main components having the anode, the organic layer, and the cathode which are stacked on an insulating substrate; and wherein oxygen is contained in an interface between the organic layer and the cathode.

According to a second aspect of the present invention, there is provided an organic EL device including:

an anode;

an organic layer containing at least one organic light emitting layer;

a cathode;

a cap used to encapsulate device main components having the anode, the organic layer, and the cathode which are stacked on an insulation substrate; and wherein the cathode has a first cathode and a second cathode and oxygen is contained in an interface between the organic layer and the first cathode.

According to a third aspect of the present invention, there is provided an organic EL device including:

an anode;

an organic layer containing at least one organic light emitting layer;

a cathode;

a cap used to encapsulate device main components having the anode, the organic layer, and the cathode which are stacked on an insulation substrate; and wherein the cathode has of a plurality of layers and an oxygen content in a first cathode contained in the plurality of layers being in contact with the organic layer is larger than that in any cathode formed on a second cathode and afterward being not in contact with the organic layer.

In the foregoing, a preferable mode is one wherein a film thickness of the cathode is 20 nm to 100 nm.

According to a fourth aspect of the present invention, there is provided a method for manufacturing an organic EL device for encapsulating device main components having an anode, an organic layer containing at least one organic light emitting layer and a cathode which are formed on an insulating substrate using a cap:

wherein the insulating substrate on which the device main components are formed are put into a vacuum apparatus before encapsulation and oxygen is contained in an interface between the organic layer and the cathode in a reduced pressure atmosphere.

According to a fifth aspect of the present invention, there is provided a method for manufacturing an organic EL device for encapsulating device main components having an anode, an organic layer containing at least one organic light emitting layer, and cathodes consisting of a plurality of layers which are formed on an insulating substrate using a cap, the method including:

a process of performing, after having formed a conductive film on the insulating substrate, a patterning operation on the conductive film so as to produce a desired shape in order to form the anode;

a process of putting the insulating substrate on which the anode has been formed into a vacuum apparatus and stacking sequentially the organic layer and a first cathode contained in cathodes having a plurality of layers on the anode in a reduced pressure atmosphere;

a process of introducing oxygen gas in the vacuum apparatus with a reduced pressure atmosphere maintained and causing the oxygen gas to be brought into contact with the first cathode;

a process of stacking cathodes to be formed after a second cathode has been formed on the first cathode in a reduced pressure atmosphere to form the device main components; and a process of encapsulating the device main components using the cap.

In the foregoing, a preferable mode is one wherein a film thickness of the cathode is 20 nm to 100 nm.

Also, a preferable mode is one wherein the oxygen gas is introduced so that a partial pressure of oxygen in the vacuum apparatus is $2 \times 10^{-4}$ to $1 \times 10^{-1}$ pascals.

Furthermore, a preferable mode is one wherein a vacuum evaporation apparatus is used as the vacuum apparatus.

With the above configurations, the device main components with the interface interposed between the organic light emitting layer and the cathode are formed on the insulating substrate and oxygen is contained in the interface between the organic light emitting layer and the cathode and therefore the stable level is formed in the interface.

With still another configuration, while the insulating substrate on which the device main components with the interface interposed between the organic light emitting layer and the cathode are put into the vacuum evaporation apparatus and, while vacuum is being maintained, the oxygen gas is introduced to cause oxygen to be contained in the interface of the organic light emitting layer and the cathode and therefore it is possible to shorten process time for manufacturing the organic EL device. As a result, without reducing a throughput in manufacturing the organic EL device, a high rectification ratio can be obtained.

BRIEF DESCRIPTION OF THE DRAWINGS

The above and other objects, advantages, and features of the present invention will be more apparent from the following description taken in conjunction with accompanying drawings in which:

FIG. 6 is a table showing rectification ratios obtained when a partial pressure of oxygen is changed in the vacuum evaporation apparatus in experiments directed to the present invention;

FIG. 7 is also a table showing rectification ratios obtained in the comparative example;

FIG. 8 is a table showing rectification ratios obtained when a film thickness of a cathode in the organic EL device is changed in experiments directed to the present invention;

FIG. 9 is also a table showing the rectification ratios obtained in the comparative example;

DETAILED DESCRIPTION OF THE PREFERRED EMBODIMENTS

Best modes of carrying out the present invention will be described in further detail using various embodiments with reference to accompanying drawings.

EMBODIMENT

Figure 1:
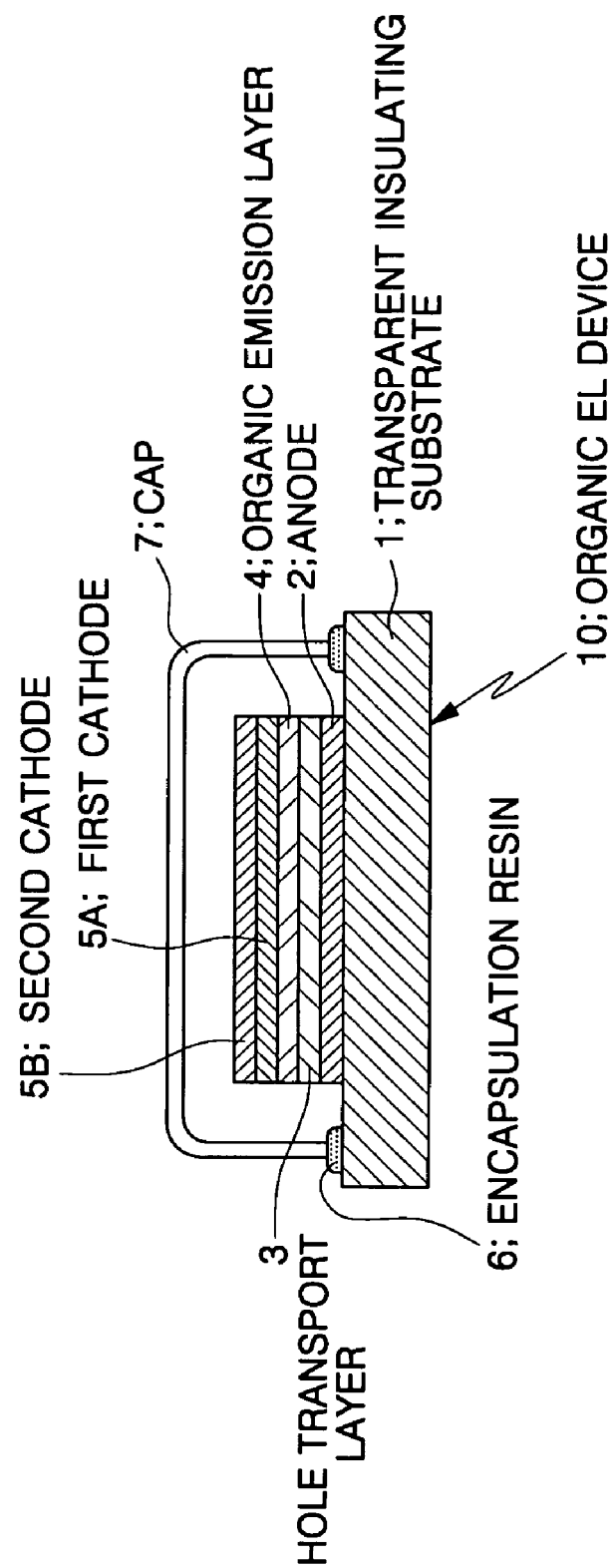
FIG. 1 is a cross-sectional view showing configurations of an organic EL device according to an embodiment of the present invention.
Figure 3:
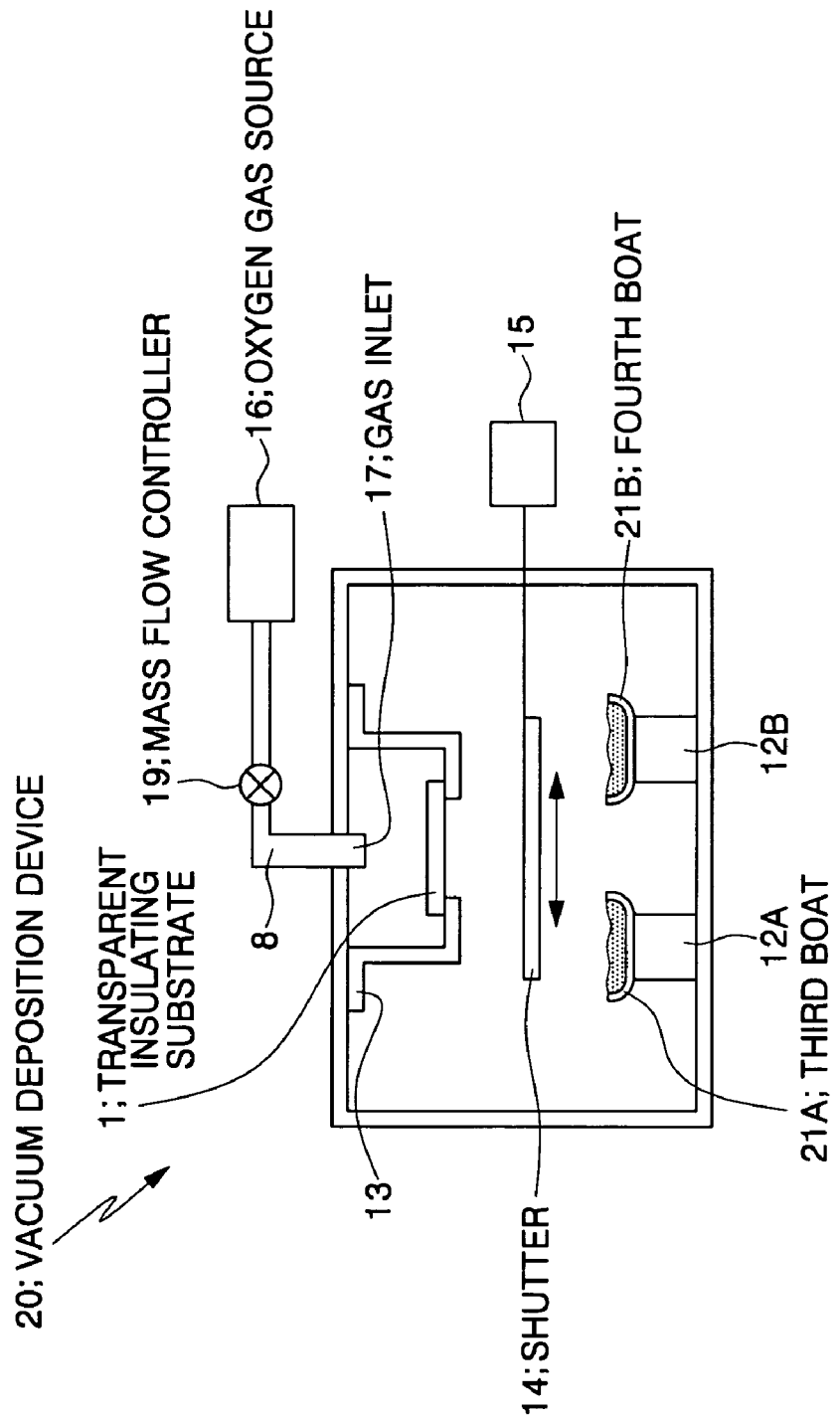
FIG. 3 is a diagram schematically showing configurations of a vacuum evaporation apparatus used in main processes in the method for manufacturing the organic EL device according to the embodiment of the present invention.
Figure 4:
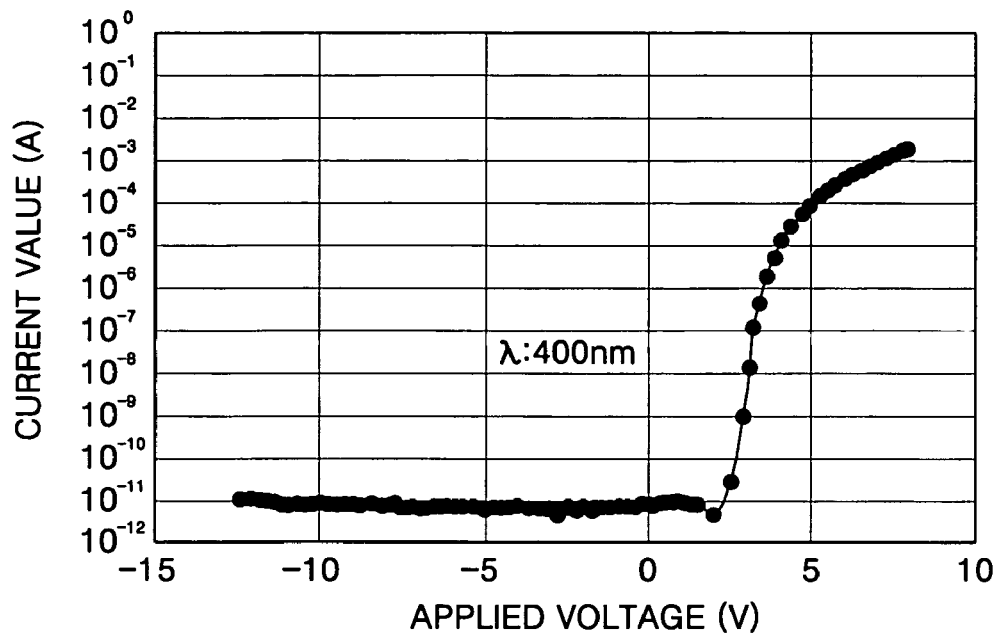
FIG. 4 is a graph illustrating a rectification property of the organic EL device according to the embodiment of the present invention.
Figure 5:
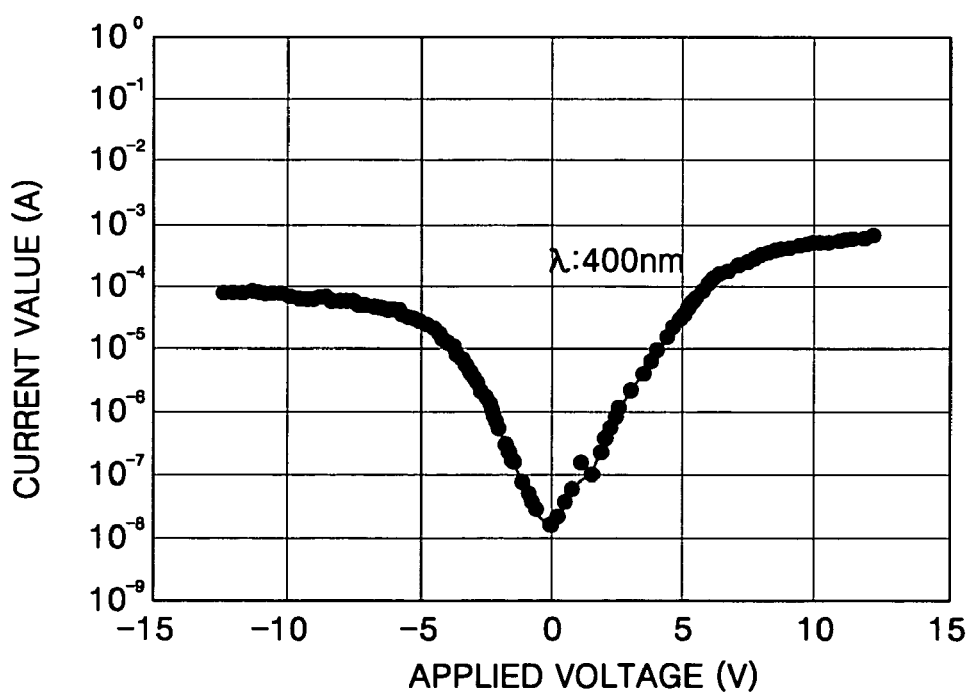
FIG. 5 is a graph illustrating a rectification property of an organic EL device in a comparative example.
Figure 10:
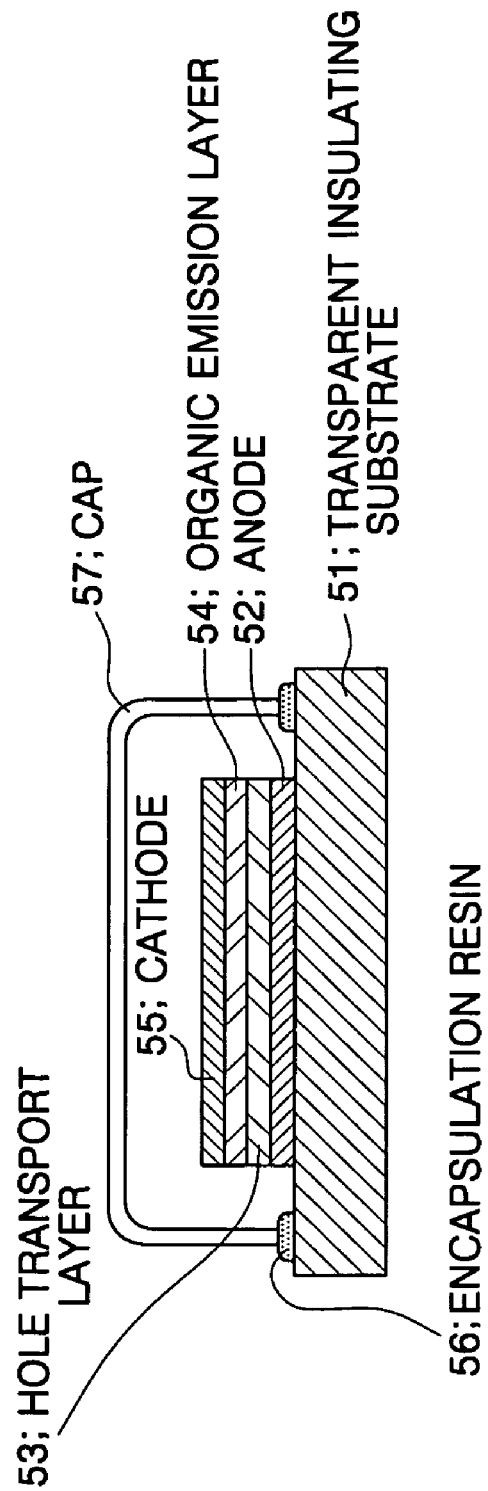
FIG. 10 is a diagram schematically showing configurations of a conventional and general organic EL device.
Figure 11:
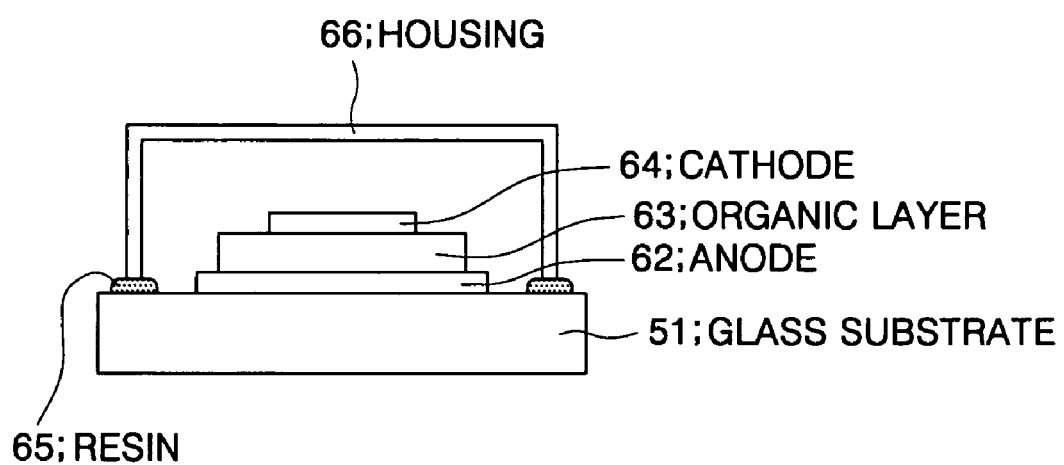
FIG. 11 is a diagram schematically showing configurations of the conventional organic EL device.

FIG. 1 is a cross-sectional view showing configurations of an organic EL device according to the embodiment of the present invention. FIGS. 2A to 2D are process diagrams showing configurations of a method for manufacturing the organic EL device in order of processes according to the embodiment. FIG. 3 is a diagram schematically showing configurations of a vacuum evaporation system used in main processes in the method for manufacturing the organic EL device according to the embodiment. FIG. 4 is a graph illustrating a rectification property of the organic EL device according to the embodiment of the present invention. FIG. 5 is a graph illustrating a rectification property of the organic EL device in a comparative example.

The organic EL device 10 of the embodiment, as shown in FIG. 1, includes a transparent insulating substrate 1 made of a glass substrate or a like, an anode 2 made of a transparent conductive material such as ITO or a like and formed on the transparent insulating substrate 1, a hole transporting layer 3 made of α-NPD ([N,N'-diphenyl]-N,N'-bis(1-naphthyl)-(1,1'-biphenyl-(4,4'-diamine)]) or a like and formed on the anode 2, an organic light emitting layer 4 made of $Alq_3$ ([tris-(8-quinolinolate aluminum complex)] and formed on the hole transporting layer 3, a first cathode 5A having a film thickness of 20 nm to 100 nm made of AlLi (aluminum lithium) and formed on the organic light emitting layer 4, a second cathode 5B made of Al or a like and formed, after oxygen has been brought into contact with a surface of the first cathode 5A, on the first cathode 5A, and a cap 7 mounted on the transparent insulating substrate 1 on which main components having the anode 2, hole transporting layer 3, organic light emitting layer 4, first cathode 5A, second cathode 5B are formed, in a manner so as to cover the main components, with an encapsulating resin 6 interposed between the transparent insulating substrate 1 and the cap 7.

In the organic EL device 10 of the embodiment, after the first cathode 5A has been formed, oxygen is brought into contact with the surface of the first cathode 5A, which causes the oxygen to enter an inside portion of the first cathode 5A from its surface and to be dispersed in an interface between the organic light emitting layer 4 and the first cathode 5A and to fill in defective portions existing in the interface, thus changing an unstable level to a stable level state and producing a perfect state of the interface. By making perfect the state of the interface between the organic light emitting layer 4 and the first cathode 5A, an increase in a leakage current can be successfully inhibited and the short between the cathode and anode can be avoided, which enable properties of the organic EL device to be stabilized. Moreover, by mounting both the first cathode 5A and the second cathode 5B, the thickness of the cathode can be made larger, which decreases wiring resistance. Thus, luminance unevenness at a time of light emitting can be prevented.

Next, the method for manufacturing the organic EL device 10 will be explained in order of processes by referring to FIG. 2.

Figure 2A:
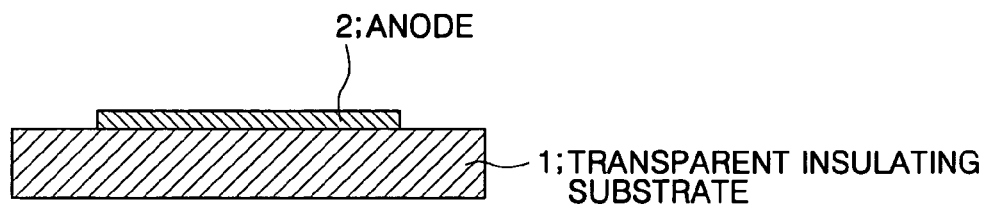
FIGS. 2A to 2D are process diagrams showing configurations of a method for manufacturing the organic EL device in order of processes according to the embodiment of the present invention.

First, as shown in FIG. 2A, the ITO film having a thickness of about 150 nm, as a transparent conductive film, is formed, by a sputtering method, on the transparent insulating substrate 1 made of a sufficiently cleaned glass substrate or a like. Then, after the anode 2 has been formed by performing patterning operations on the ITO film using a photolithography method so that a light emitting area of the organic EL device 10 is 2 $mm^2$, the transparent insulating substrate 1 and the anode 2 are cleaned using IPA (Iso-Propyl Alcohol) and pure water and then ultrasonic cleaning is performed using the IPA followed by cleaning with a UV ozone cleaner to remove residual organic substances from surfaces of the transparent insulating substrate 1 and the anode 2.

Figure 2B:
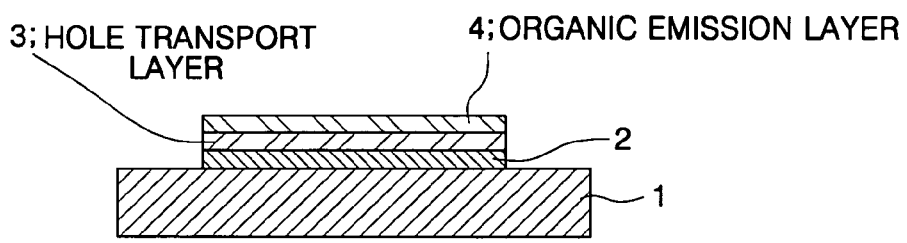

Next, as shown in FIG. 2B, on the anode 2 are sequentially formed the hole transporting layer 3 and the organic light emitting layer 4. The formation of the hole transparent layer 3 and the organic light emitting layer 4 are performed in a following way.

First, a molybdenum boat (first boat) containing 100 mg of α-NPD as a hole transporting material and another molybdenum boat (second boat) containing $Alq^3$ as a light emitting material are placed in a vacuum evaporation apparatus so that each of the boats is operated as a separate evaporation source. Then, after the transparent insulating substrate 1 has been housed in the vacuum evaporation apparatus, air is removed until a degree of the vacuum in the vacuum evaporation apparatus becomes $2 \times 10^{-4}$ pascals and then the first boat is heated.

Then, after a heating temperature is controlled until an evaporation speed of the α-NPD within the first boat becomes a constant speed of 0.3 nm/sec, a shutter pre-attached to an upper portion of the vacuum evaporation apparatus is opened to start the deposition of the α-NPD and the shutter is closed at a time when a thickness of the film reaches about 50 nm to terminate the deposition.

Next, in a similar manner, after a heating temperature is controlled until an evaporation speed of the $Alq_3$ within the second boat becomes a constant speed of 0.3 nm/sec, the shutter being pre-attached to the upper portion of the vacuum evaporation apparatus is opened to start the deposition of the $Alq^3$ and the shutter is closed at a time when a thickness of the film reaches about 55 nm to terminate the deposition.

Thus, the hole transporting layer 3 made of the α-NPD and the organic light emitting layer 4 made of the $Alq^3$ are formed on the anode 2.

Figure 2C:
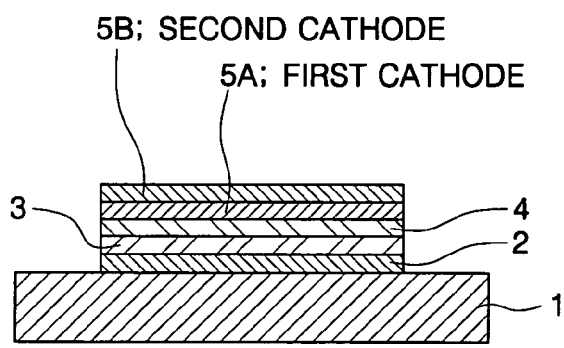

Next, the substrate 1 is moved into another vacuum evaporation apparatus 20, as shown in FIG. 3, connected to the above vacuum evaporation apparatus, with the vacuum still being maintained, to form the first cathode 5A on the organic light emitting layer 4, as shown in FIG. 2C.

The vacuum evaporation apparatus 20, as shown in FIG. 3, includes a container 11 (chamber), boat supporting bases 12A and 12B placed at a bottom of the container 11, a substrate supporting body 13 placed in an upper portion inside of the container 11, a shutter 14 placed in the upper portion inside of the container 11, a shutter driving section 15 used to control a position of the shutter 14 in a horizontal direction, an oxygen gas source 16 attached outside of the container 11, a gas pipe 18 attached outside of the container 11 used to supply oxygen gas from the oxygen gas source 16 to a gas introducing terminal 17, and a mass-flow controller 19 placed at a midway of the gas pipe 18.

In the container 11 of the vacuum evaporation apparatus 20, a molybdenum boat (a third boat 21A) containing 1 g of AlLi (Aluminum lithium) connected to a resistance heating source (not shown) and another molybdenum boat (fourth boat 21B) containing 1 g of Al (Aluminum) also connected to the resistance heating source (not shown) are placed in advance. Moreover, a flow of the oxygen gas introduced from the gas introducing terminal 17 into the container 11 of the vacuum evaporation apparatus 20 is controlled by the mass-flow controller 19. At a time when the degree of the vacuum becomes less than $4 \times 10^{-4}$ pascals by degassing the container 11 of the vacuum evaporation apparatus 20, the above third boat 21A is heated by the resistance heating source (not shown). At this point, a heating temperature is controlled so that the evaporation speed of the AlLi existing in the third boat 21A becomes a constant speed of 0.4 nm/sec. Then, the shutter 14 being attached in the upper portion inside of the container 11 is opened by moving the shutter driving section 15 in a horizontal direction to start deposition of the AlLi and, when a thickness of the film reaches about 60 nm, the shutter 14 is closed to terminate the deposition of the AlLi.

Thus, the first cathode 5A made of AlLi is formed on the organic light emitting layer 4.

Next, in order to cause oxygen to be contained in the interface between the organic light emitting layer 4 and the first cathode 5A, oxygen gas is introduced into the vacuum evaporation apparatus 20.

The oxygen gas to be introduced from the gas introducing terminal 17 into the container 11 through the gas pipe 18 from the oxygen gas source 16 in the vacuum evaporation apparatus 20 is controlled by the mass-flow controller 19 so that its flow becomes about 10 SCCM (Standard Cubic Centimeter per Minute). At this point, the vacuum in the container 11 is $4 \times 10^{-2}$ pascals. After about five minutes, the introduction of the oxygen gas is stopped and the oxygen gas is exhausted from the container 11 until the vacuum in the container 11 becomes $4 \times 10^{-4}$ pascals and then a fourth boat 21B is heated by the resistance heating source (not shown). Then, after the heating temperature is controlled so that the evaporation speed of Al in the fourth boat 21B becomes a constant speed of 0.4 nm/sec, the shutter 14 is opened to start deposition of the Al and, when a thickness of the film reaches about 200 nm, the shutter 14 is closed to terminate the deposition.

Thus, the second cathode 5B made of Al is formed on the first cathode 5A, as shown in FIG. 2C. This means that device main components having the anode 2, hole transporting layer 3, organic light emitting layer 4, first cathode 5A, and second cathode 5B are formed on the transparent insulating substrate 1. Since the introduction of the oxygen gas being the process carried out before the formation process of the second cathode 5B is performed with the vacuum still being maintained, time required for drawing the vacuum at the time of formation of the second cathode 5B can be shortened and, as a result, process time can be reduced.

As described above, the introduction of the oxygen gas into the container 11 enables oxygen to be contained in the interface between the organic light emitting layer 4 and the first cathode 5A. The introduced oxygen serves to form a stable level at the interface between the organic light emitting layer 4 and the first cathode 5A and, as a result, the state of the interface between the organic light emitting layer 4 and the first cathode 5A is made perfect. Furthermore, the second cathode 5B is formed on the first cathode 5A, which is also operated as the cathode, together with the first cathode 5A.

Figure 2D:
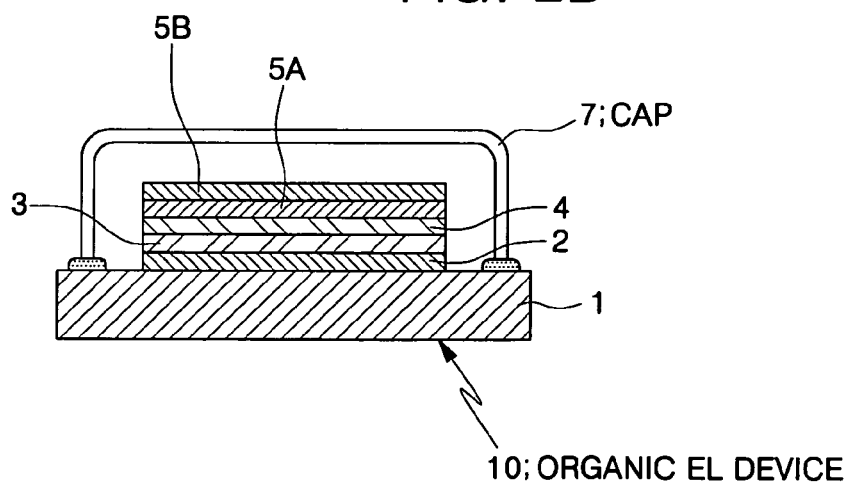

Next, after the transparent insulating substrate 1 has been moved into an encapsulating chamber (not shown), as shown in FIG. 2D, the device main components having the anode 2, hole transporting layer 3, organic light emitting layer 4, first cathode 5A, and second cathode 5B are encapsulated in a manner that the cap 7 made of glass or a like covers the device main components with, for example, UV curable encapsulating resin 6 being interposed between the cap 7 and the transparent insulating substrate 1, to finish the organic EL device 10. When the encapsulating resin 6 is cured for encapsulation, the device main components having the anode 2, hole transporting layer 3, organic light emitting layer 4, first cathode 5A and second cathode 5B are shielded from the UV light and the light is applied only to the encapsulating resin 6.

In the method for manufacturing the organic EL device 10 described above, since the introduction of the oxygen gas before the process of the encapsulation to cause the oxygen to be contained in the interface between the organic light emitting layer 4 and the first cathode 5A to stabilize device properties is performed with the transparent insulating substrate 1 being placed in the container 11 of the vacuum evaporation apparatus 20 and with the vacuum being still maintained, the process time for the manufacturing can be shortened.

Next, by using a semiconductor parameter analyzer, rectification properties of the organic EL device 10 manufactured by the method for manufacturing the organic EL device 10 of the embodiment are measured. The measurements are made by applying a forward voltage and a reverse voltage between the anode 2 and the second cathode 5B of the organic EL device 10. An area of light emitting is 2 mm$^2$.

FIG. 4 is a graph illustrating the rectification properties of the organic EL device 10 according to the embodiment of the present invention. Light having an irradiation wavelength λ of 400 nm is applied. A current is plotted as ordinate and an applied voltage is plotted as abscissa. Here, a ratio of a forward current "If" at the forward voltage of 8 V to a reverse current "Ir" at a reverse voltage of 8V is defined as a rectification ratio (If/Ir). It has been confirmed from an experiment that, since almost no reverse current "Ir" flowed, rectification of as large as $4.0 \times 10^8$ was obtained, thus providing excellent rectification property.

FIG. 5 is a graph illustrating, in a comparative example, a rectification property of an organic EL device manufactured by almost the same method as employed in this embodiment except that no introduction of oxygen gas after the formation of the first cathode 5A is needed. It has been confirmed from the experiment that, in the comparative example, since the reverse current "Ir" flows at the time of applying the reverse voltage, the rectification ratio of as small as $6.8 \times 10^2$ only was obtained, thus showing that the rectification properties have degraded.

As is apparent from FIGS. 4 and 5, by introducing oxygen gas after the formation of the first cathode 5A to cause oxygen to be contained in the interface between the organic light emitting layer 4 and the first cathode 5A, it is possible to obtain the greater rectification ratio. The reason for this is that the introduction of the oxygen gas after the formation of the first cathode 5A causes oxygen to be contained in the interface between the organic light emitting layer 4 and the first cathode 5A which enables the perfect state of the interface between the organic light emitting layer 4 and the first cathode 5A to be produced.

In contrast, the reason for the degraded rectification ratio in the comparative example as shown in FIG. 5 seems to be that, since the oxygen gas was not introduced after the formation of the first cathode 5A, the interface between the organic light emitting layer 4 and the first cathode 5A did not contain oxygen and, therefore, no perfect state of the interface between the organic light emitting layer 4 and the first cathode 5A was achieved.

The results of the analysis conducted by the inventor of the present invention show that, when oxygen is brought into contact with the cathode layer formed on the organic layer, oxygen enters the cathode layer and reaches the interface between the organic layer and the cathode, which improves the rectification properties. That is, it is thought that oxygen enters the defect existing at the interface between the organic layer and the cathode which serves to cause the impurity level to disappear. This is a state in which the oxygen has filled in the defect occurring when the cathode is formed on the organic layer and this state is different from a state in which, after a metal oxide layer is uniformly pre-stacked on the organic layer, the cathode layer is further stacked on the metal oxide layer. Here, it has been confirmed from the experiment that, if a partial pressure of the oxygen in the vacuum evaporation apparatus is $2\times10^{-4}$ to $1\times10^{-1}$ pascals in particular, the excellent result can be obtained. FIG. 6 is a table showing the rectification ratio obtained when the partial pressure of oxygen was changed in the vacuum evaporation apparatus in experiments conducted in the embodiment of the present invention, which supports the above description. FIG. 7 is also a table showing the rectification ratio obtained in the comparative example. As the comparative example, the rectification ratio obtained when the partial pressure of oxygen was set outside the range of $2\times10^{-4}$ to $1\times10^{-1}$ is shown in FIG. 7.

In FIG. 6, item No. 1 in the table shows a case where the partial pressure of oxygen is set at $2\times10^{-4}$ pascals and the obtained rectification ratio is $3\times10^{8}$. Similarly, item No. 2 shows a case where the partial pressure of oxygen is set at $2\times10^{-3}$ rascals and the obtained rectification ratio is $2\times10^{8}$. Item No. 3 shows a case where the partial pressure of oxygen is set at $5\times10^{-2}$ pascals and the obtained rectification ratio is $1\times10^{8}$. Item No. 4 shows a case where the partial pressure of oxygen is set at $1\times10^{-1}$ pascals and the obtained rectification ratio is $2.8\times10^{8}$. In any case, the rectification ratio is high.

On the other hand, in FIG. 7, item No. 1 in the table shows a case where the partial pressure of oxygen is $1\times10^{-4}$ pascals and the obtained rectification ratio is $3\times10^{4}$. Similarly, item No. 2 shows a case where the partial pressure of oxygen is set at $2\times10^{-5}$ pascals and the obtained rectification ratio is $2\times10^{4}$. The rectification ratios are remarkably smaller than those shown in FIG. 6, indicating that the rectification properties are degraded.

As is apparent from FIGS. 6 and 7, when the partial pressure of oxygen is set at $2\times10^{-4}$ to $1\times10^{-1}$ pascals in particular, the great rectification ratio can be obtained.

As shown in FIG. 7, if the partial pressure of oxygen is set outside the range of $2\times10^{-4}$ to $1\times10^{-1}$ pascals, it causes a decrease in a throughput in manufacturing and/or excessive consumption of oxygen and therefore the rectification ratio cannot be made large.

Furthermore, it has been confirmed from the experiment and analysis that, when the film thickness of the cathode is 20 nm to 100 nm in particular, excellent results can be obtained. FIG. 8 is a table showing rectification ratios obtained when the film thickness of the cathode in the organic EL device 10 is changed in experiments conducted in the embodiment of the present invention, which support the above description. FIG. 9 is also a table showing the rectification ratios obtained in the comparative example in which the film thickness of the cathode is set outside the range of 20 nm to 100 nm.

In FIG. 8, item No. 1 in the table shows a case where the film thickness of the cathode is set at 20 nm and the obtained rectification ratio is $3.9\times10^{8}$. Similarly, item No. 2 shows a case where the film thickness of the cathode is set at 40 nm and the obtained rectification ratio is $1.2\times10^{8}$. Item No. 3 shows a case where the film thickness of the cathode is set at 70 nm and the obtained rectification ratio is $1.6\times10^{8}$. Item No. 4 shows a case where the film thickness of the cathode is set at 100 nm and the obtained rectification ratio is $2.7\times10^{8}$. In any case, the rectification ratio is high.

On the other hand, in FIG. 9, item No. 1 in the table shows a case where the film thickness of the cathode is set at 10 nm and the obtained rectification ratio is $1.0\times10^{5}$. Similarly, item No. 2 shows a case where the film thickness of the cathode is set at 200 nm and the obtained rectification ratio is $6.9\times10^{3}$. Item No. 3 shows a case where the film thickness of the cathode is set at 300 nm and the obtained rectification ratio is $4.2\times10^{2}$. Item No. 4 shows a case where the film thickness of the cathode is set at 500 nm and the obtained rectification ratio is $5.2\times10^{2}$. The above rectification ratios are remarkably smaller than those shown in FIG. 8, indicating that the rectification properties have been degraded.

As is apparent from FIGS. 8 and 9, when the film thickness of the cathode is set within the range of 20 nm to 100 nm in particular, the great rectification ratio can be obtained.

On the other hand, if the film thickness is set outside the range of 20 nm to 100 nm in particular, it is impossible to make large the rectification ratio. If the film thickness of the cathode is smaller than 20 nm, the inside of the film of the cathode becomes loose, making it impossible to make large the rectification ratio. Moreover, if the film thickness of the cathode is larger than 100 nm, it is difficult for the oxygen to enter the cathode, thus reducing the amount of the oxygen that can reach the interface between the organic layer and the cathode and causing the rectification ratio to be smaller. If the film thickness of the cathode is about 100 nm, the electrical resistance is high and, in some cases, a display failure caused by luminance unevenness occurs and therefore it is preferable that, the cathode is made thick after being brought into contact with oxygen.

Furthermore, it has been also confirmed that, the rectification properties are improved by bringing the cathode into contact with oxygen, however, when a vacuum is again drawn in the vacuum evaporation apparatus, the rectification properties are slightly degraded. This suggests that there is a likelihood that the defect existing at the interface between the organic light emitting layer 4 and the first cathode 5A is in a state in which the oxygen in a molecular state has been adsorbed into the defect.

Thus, according to the organic EL device 10 of the embodiment of the present invention in which the device main components having the anode 2, hole transporting layer 3, organic light emitting layer 4, first cathode 5A and second cathode 5B are formed on the transparent insulating substrate 1, since the oxygen is contained in the interface between the organic light emitting layer 4 and the first cathode 5A, stable level is formed in the interface.

Also, according to the method for manufacturing the organic EL device 10 of the embodiment, while the transparent insulating substrate 1 on which the anode 2, hole transporting layer 3, organic light emitting layer 4, first cathode, 5A and second cathode 5B have been formed is put into the vacuum evaporation apparatus 20 and, while the reduced pressure atmosphere is being maintained, the oxygen gas is introduced to cause oxygen to be contained in the interface of the organic light emitting layer 4 and the first cathode 5A and therefore it is possible to shorten the process time for the manufacturing. As a result, without a decrease in throughput in manufacturing the organic EL device 10, a high rectification ratio can be obtained.

It is apparent that the present invention is not limited to the above embodiments but may be changed and modified without departing from the scope and spirit of the invention. For example, in the above embodiment, as the material for the anode 2 to be formed on the transparent insulating substrate 1, ITO is used, however, other materials for the electrode such as $SnO_2$ (tin dioxide) or a like may be employed. It is preferable but not necessarily limited to a transparent conductive material.

It is possible to use a non-transparent insulating substrate instead of the transparent insulating substrate. Moreover, as the cathode, other materials for the electrode including not only AlLi but also Al, MgAg or like may be used. Furthermore, as the materials for the hole transporting layer 3, other materials including not only the α-NPD but also bis(di(p-tolyl)aminophenyl-1, 1-cyclohexane, N,N'-diphenyl-N, N'-bis(3-methylphenyl)-1,1'-bisphenyl-4, 4'-diamine,N,N'-diphenyl-N-N-bis(1-naphtyl)-(1,1'-bisphenyl)-4, 4'-diamine, a star-burst type molecule or a like may be used.

Also, in the above embodiments, the device main components have the anode 2, hole transporting layer 3, organic light emitting layer 4, first cathode 5A and second cathode 5B, however, so long as the interface is formed between the organic layer and cathode layer, the main components may have the anode, organic light emitting layer and cathode, or have the anode, organic light emitting layer, electron transporting layer (made of organic substance) and the cathode or the like. Moreover, the cathode may be made up of a plurality of layers so long as an oxygen content in the first cathode 5A contained in the two or more layers being in contact with organic layers including the organic light emitting layer 4 is larger than that in any cathode layer formed on the second cathode 5B and afterward being not in contact with the organic layer.

What is claimed is:

1. An organic electro luminescence device, comprising:
  an anode;
  an organic layer containing at least one organic light emitting layer; a cathode;
  a cap used to encapsulate device main components having said anode, said organic layer,
  and said cathode which are stacked on an insulating substrate; and
  wherein said cathode has a plurality of layers and an oxygen content in a first metallic cathode contained in said plurality of layers being in contact with said organic layer is larger than that in any layer of cathode formed on said first metallic cathode and being not in contact with said organic layer.

2. The organic EL device of claim 1, wherein a film thickness of said first cathode is 20 nm to 100 nm.

* * * * *